(12) United States Patent
Hoogendam et al.

(10) Patent No.: US 7,352,440 B2
(45) Date of Patent: Apr. 1, 2008

(54) SUBSTRATE PLACEMENT IN IMMERSION LITHOGRAPHY

(75) Inventors: Christiaan Alexander Hoogendam, Veldhoven (NL); Gerrit Johannes Nijmeijer, Eindhoven (NL); Minne Cuperus, Veldhoven (NL); Petrus Anton Willem Cornelia Maria Van Eijck, Budel (NL)

(73) Assignee: ASML Netherlands B.V., Veldhoven (NL)

( * ) Notice: Subject to any disclaimer, the term of this patent is extended or adjusted under 35 U.S.C. 154(b) by 145 days.

(21) Appl. No.: 11/008,576

(22) Filed: Dec. 10, 2004

(65) Prior Publication Data

US 2006/0126038 A1 Jun. 15, 2006

(51) Int. Cl.
*G03B 27/52* (2006.01)
*G03B 27/42* (2006.01)
*G03B 27/58* (2006.01)

(52) U.S. Cl. ............................ 355/55; 355/53; 355/72
(58) Field of Classification Search ................. 355/30, 355/55, 53, 72; 356/399–401; 250/548
See application file for complete search history.

(56) References Cited

U.S. PATENT DOCUMENTS

| | | | | |
|---|---|---|---|---|
| 3,573,975 | A | 4/1971 | Dhaka et al. ................. 117/212 |
| 3,648,587 | A | 3/1972 | Stevens ............................ 95/44 |
| 4,346,164 | A | 8/1982 | Tabarelli et al. ............... 430/311 |
| 4,390,273 | A | 6/1983 | Loebach et al. ................ 355/125 |
| 4,396,705 | A | 8/1983 | Akeyama et al. ............... 430/326 |
| 4,480,910 | A * | 11/1984 | Takanashi et al. .............. 355/30 |
| 4,509,852 | A | 4/1985 | Tabarelli et al. ................ 355/30 |
| 5,040,020 | A | 8/1991 | Rauschenbach et al. ........ 355/53 |
| 5,121,256 | A | 6/1992 | Corle et al. ..................... 359/664 |
| 5,563,798 | A | 10/1996 | Berken et al. .................. 364/478.06 |
| 5,610,683 | A | 3/1997 | Takahashi ......................... 355/53 |
| 5,715,039 | A | 2/1998 | Fukuda et al. |
| 5,825,043 | A | 10/1998 | Suwa ............................... 250/548 |
| 5,900,354 | A | 5/1999 | Batchelder ..................... 430/395 |
| 6,126,382 | A | 10/2000 | Scales et al. |
| 6,191,429 | B1 | 2/2001 | Suwa ............................... 250/548 |
| 6,197,117 | B1 | 3/2001 | Li et al. ........................ 118/715 |
| 6,236,634 | B1 | 5/2001 | Lee et al. ....................... 369/112 |

(Continued)

FOREIGN PATENT DOCUMENTS

DE 206 607 2/1984

(Continued)

OTHER PUBLICATIONS

M. Switkes et al., "Immersion Lithography at 157 nm", MIT Lincoln Lab, Orlando Jan. 2001, Dec. 17, 2001.

(Continued)

*Primary Examiner*—Henry Hung Nguyen
(74) *Attorney, Agent, or Firm*—Pillsbury Winthrop Shaw Pittman LLP

(57) ABSTRACT

A method for determining an offset between a center of a substrate and a center of a depression in a chuck includes providing a test substrate to the depression, the test substrate having a dimension smaller than a dimension of the depression, measuring a position of an alignment mark of the test substrate while in the depression, and determining the offset between the center of the substrate and the center of the depression from the position of the alignment mark.

18 Claims, 7 Drawing Sheets

U.S. PATENT DOCUMENTS

| | | |
|---|---|---|
| 6,600,547 B2 | 7/2003 | Watson et al. ............... 355/30 |
| 6,603,130 B1 | 8/2003 | Bisschops et al. ........ 250/492.1 |
| 2002/0020821 A1 | 2/2002 | Van Santen et al. ........ 250/492 |
| 2002/0163629 A1 | 11/2002 | Switkes et al. ............... 355/53 |
| 2003/0123040 A1 | 7/2003 | Almogy ...................... 355/69 |
| 2003/0178145 A1 | 9/2003 | Anderson et al. |
| 2004/0000627 A1 | 1/2004 | Schuster ................. 250/201.2 |
| 2004/0075895 A1 | 4/2004 | Lin ........................... 359/380 |
| 2004/0114117 A1 | 6/2004 | Bleeker ...................... 355/53 |
| 2004/0136494 A1 | 7/2004 | Lof et al. .................... 378/34 |
| 2004/0143412 A1 | 7/2004 | Donald ...................... 702/150 |
| 2004/0149906 A1* | 8/2004 | Mankos et al. ............ 250/310 |
| 2004/0160582 A1 | 8/2004 | Lof et al. .................... 355/30 |
| 2004/0165159 A1 | 8/2004 | Lof et al. .................... 355/30 |
| 2004/0167743 A1 | 8/2004 | Hosek |
| 2004/0207824 A1 | 10/2004 | Lof et al. .................... 355/30 |
| 2004/0211920 A1 | 10/2004 | Derksen et al. ......... 250/492.1 |
| 2004/0239954 A1 | 12/2004 | Bischoff .................... 356/635 |
| 2004/0263809 A1 | 12/2004 | Nakano ...................... 355/30 |
| 2005/0007569 A1 | 1/2005 | Streefkerk et al. ........... 355/30 |
| 2005/0016818 A1* | 1/2005 | Ito et al. .................. 198/345.1 |
| 2005/0018155 A1 | 1/2005 | Cox et al. .................... 355/30 |
| 2005/0024609 A1 | 2/2005 | De Smit et al. ............. 355/18 |
| 2005/0030497 A1 | 2/2005 | Nakamura ................... 355/30 |
| 2005/0046813 A1 | 3/2005 | Streefkerk et al. ........... 355/30 |
| 2005/0046934 A1 | 3/2005 | Ho et al. .................... 359/380 |
| 2005/0052632 A1 | 3/2005 | Miyajima ................... 355/53 |
| 2005/0094116 A1 | 5/2005 | Flagello et al. ............... 355/53 |
| 2005/0094125 A1 | 5/2005 | Arai ............................ 355/72 |
| 2005/0122505 A1 | 6/2005 | Miyajima ................... 355/72 |
| 2005/0132914 A1 | 6/2005 | Mulkens et al. ......... 101/463.1 |
| 2005/0134817 A1 | 6/2005 | Nakamura ................... 355/53 |
| 2005/0140948 A1 | 6/2005 | Tokita ......................... 355/30 |
| 2005/0146693 A1 | 7/2005 | Ohsaki ........................ 355/30 |
| 2005/0146694 A1 | 7/2005 | Tokita ......................... 355/30 |
| 2005/0151942 A1 | 7/2005 | Kawashima ................ 355/30 |
| 2005/0200815 A1 | 9/2005 | Akamatsu ................... 353/53 |
| 2005/0213065 A1 | 9/2005 | Kitaoka ....................... 355/53 |
| 2005/0213066 A1 | 9/2005 | Sumiyoshi .................. 355/53 |
| 2005/0219489 A1 | 10/2005 | Nei et al. .................... 355/53 |
| 2005/0233081 A1 | 10/2005 | Tokita ....................... 427/256 |
| 2005/0259234 A1 | 11/2005 | Hirukawa et al. |
| 2005/0264774 A1 | 12/2005 | Mizutani et al. |
| 2007/0216893 A1 | 9/2007 | Yasuda |

FOREIGN PATENT DOCUMENTS

| | | |
|---|---|---|
| DE | 221 563 | 4/1985 |
| DE | 224 448 | 7/1985 |
| DE | 242 880 | 2/1987 |
| EP | 0023231 | 2/1981 |
| EP | 0418427 | 3/1991 |
| EP | 0 597 637 A1 | 5/1994 |
| EP | 0 634 785 | 7/1994 |
| EP | 1039511 | 9/2000 |
| EP | 1 063 186 | 12/2000 |
| EP | 1 134 618 A2 | 9/2001 |
| EP | 1 571 697 | 9/2005 |
| FR | 2474708 | 7/1981 |
| JP | 58-202448 | 11/1983 |
| JP | A 59-19912 | 2/1984 |
| JP | 62-065326 | 3/1987 |
| JP | 62-121417 | 6/1987 |
| JP | 63-157419 | 6/1988 |
| JP | 04-305915 | 10/1992 |
| JP | 04-305917 | 10/1992 |
| JP | A 05-62877 | 3/1993 |
| JP | 06-124873 | 5/1994 |
| JP | 07-132262 | 5/1995 |
| JP | 07-220990 | 8/1995 |
| JP | A 08-316125 | 11/1996 |
| JP | 10-228661 | 8/1998 |
| JP | 10-255319 | 9/1998 |
| JP | 10-303114 | 11/1998 |
| JP | 10-340846 | 12/1998 |
| JP | 11-176727 | 7/1999 |
| JP | 2000-058436 | 2/2000 |
| JP | 2001-091849 | 4/2001 |
| JP | 2002-207710 | 7/2004 |
| JP | 2004-193252 | 7/2004 |
| JP | 2004-207696 | 7/2004 |
| JP | 2004-259966 | 9/2004 |
| WO | WO 99/49504 | 9/1999 |
| WO | WO 2004/019128 A2 | 3/2004 |
| WO | WO 2004/019128 A3 | 3/2004 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/090577 | 10/2004 |
| WO | WO 2004/090633 | 10/2004 |
| WO | WO 2004/090634 | 10/2004 |
| WO | WO 2004/092830 | 10/2004 |
| WO | WO 2004/092833 | 10/2004 |
| WO | WO 2004/093130 | 10/2004 |
| WO | WO 2004/093159 | 10/2004 |
| WO | WO 2004/093160 | 10/2004 |
| WO | WO 2004/095135 | 11/2004 |
| WO | WO 2005/010611 | 2/2005 |
| WO | WO 2005/024517 | 3/2005 |

OTHER PUBLICATIONS

M. Switkes et al., "Immersion Lithography at 157 nm", J. Vac. Sci. Technol. B., vol. 19, No. 6, Nov./Dec. 2001, pp. 2353-2356.

M. Switkes et al., "Immersion Lithography: Optics for the 50 nm Node", 157 Anvers-1, Sep. 4, 2002.

B.J. Lin, "Drivers, Prospects and Challenges for Immersion Lithography", TSMC, Inc., Sep. 2002.

B.J. Lin, "Proximity Printing Through Liquid", IBM Technical Disclosure Bulletin, vol. 20, No. 11B, Apr. 1978, p. 4997.

B.J. Lin, "The Paths To Subhalf-Micrometer Optical Lithography", SPIE vol. 922, Optical/Laser Microlithography (1988), pp. 256-269.

G.W.W. Stevens, "Reduction of Waste Resulting from Mask Defects", Solid State Technology, Aug. 1978, vol. 21 008, pp. 68-72.

S. Owa et al., "Immersion Lithography; its potential performance and issues", SPIE Microlithography 2003, 5040-186, Feb. 27, 2003.

S. Owa et al., "Advantage and Feasibility of Immersion Lithography", Proc. SPIE 5040 (2003).

Nikon Precision Europe GmbH, "Investor Relations—Nikons's Real Solutions", May 15, 2003.

H. Kawata et al., "Optical Projection Lithography using Lenses with Numerical Apertures Greater than Unity", Microelectronics Engineering 9 (1989), pp. 31-36.

J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.

B.W. Smith et al., "Immersion Optical Lithography at 193nm", Future Fab International, vol. 15, Jul. 11, 2003.

H. Kawata et al., "Fabrication of 0.2μm Fine Patterns Using Optical Projection Lithography with an Oil Immersion Lens", Jpn. J. Appl. Phys. vol. 31 (1992), pp. 4174-4177.

G. Owen et al., "⅛μm Optical Lithography", J. Vac. Sci. Technol. B., vol. 10, No. 6, Nov./Dec. 1992, pp. 3032-3036.

H. Hogan, "New Semiconductor Lithography Makes a Splash", Photonics Spectra, Photonics Technology/World, Oct. 2003 Edition, pp. 1-3.

S. Owa and N. Nagasaka, "Potential Performance and Feasibility of Immersion Lithography", NGL Workshop 2003, Jul. 10, 2003, Slide Nos. 1-33.

S. Owa et al., "Update on 193nm immersion exposure tool", Litho Forum, International SEMATECH, Los Angeles, Jan. 27-29, 2004, Slide Nos. 1-51.

H. Hata, "The Development of Immersion Exposure Tools", Litho Forum, International SEMATECH, Los Angeles, Jan. 27-29, 2004, Slide Nos. 1-22.

T. Matsuyama et al., "Nikon Projection Lens Update", SPIE Microlithography 2004, 5377-65, Mar. 2004.

"Depth-of-Focus Enhancement Using High Refractive Index Layer on the Image Layer", IBM Technical Disclosure Bulletin, vol. 27, No. 11, Apr. 1985, p. 6521.

A. Suzuki, "Lithography Advances on Multiple Fronts", EEdesign, EE Times, Jan. 5, 2004.

B. Lin, The $k_3$ coefficient in nonparaxial λ/NA scaling equations for resolution, depth of focus, and immersion lithography, *J. Microlith., Microfab., Microsyst.* 1(1):7-12 (2002).

Search Report for European Application No. 05257411.8-2222, dated Mar. 21, 2006.

European Search Report for Appl. No. 05257411.8-1226 issued May 7, 2007.

Information Disclosure Statement filed Apr. 4, 2007 for U.S. Appl. No. 11/730,915.

* cited by examiner

SUBSTRATE PLACEMENT IN IMMERSION LITHOGRAPHY

FIELD

The present invention relates to a lithographic apparatus and in particular to an immersion lithographic apparatus and a method of substrate placement in an immersion lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g., water, so as to fill a space between the final element of the projection system and the substrate. The point of this is to enable imaging of smaller features since the exposure radiation will have a shorter wavelength in the liquid. (The effect of the liquid may also be regarded as increasing the effective numerical aperature (NA) of the system and also increasing the depth of focus.) Other immersion liquids have been proposed, including water with solid particles (e.g., quartz) suspended therein.

However, submersing the substrate or substrate and substrate table in a bath of liquid (see for example U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

One of the solutions proposed is for a liquid supply system to provide liquid on only a localized area of the substrate and in between the final element of the projection system and the substrate (the substrate generally has a larger surface area than the final element of the projection system). One way which has been proposed to arrange for this is disclosed in PCT patent application no. WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

SUMMARY

An aspect of the present invention is to provide a method for determining an offset between a center of a substrate and a center of a depression in a chuck. The method includes providing a test substrate to the depression, the test substrate having a dimension smaller than a dimension of the depression, measuring a position of an alignment mark of the test substrate while in the depression and determining the offset between the center of the substrate and the center of the depression from the position of the alignment mark.

In an embodiment of the invention, providing the test substrate to the depression includes loading the test substrate with a substrate handler inside the depression.

In an embodiment of the invention, measuring the position of the alignment mark of the test substrate comprises measuring the position of the alignment mark relative to a reference mark of the chuck or vice versa.

The method may further comprise determining a position of the center of the depression relative to a position of a reference mark of the chuck or vice versa, and determining a position of the center of the test substrate relative to the position of the alignment mark of the test substrate or vice versa.

In an embodiment of the invention, measuring the position of the center of the test substrate can be performed with a prealigner.

In an embodiment of the invention, the dimension of the test substrate is such that, when the test substrate is in the depression, a gap between an edge of the test substrate and an edge of the depression is greater than a maximum offset.

In an embodiment of the invention, measuring the position of the alignment mark of the test substrate is performed with an optical system. The optical system may include, for example, an interferometer and an optical alignment system.

The method may further comprise calibrating a substrate handler to take into account the offset.

In an embodiment of the invention, calibrating the substrate handler includes shifting a positioning of substrates by the substrate handler to correct for the offset so that a subsequent substrate provided by the substrate handler to the depression is substantially centered inside the depression.

Another aspect of the present invention is to provide a method for determining an offset between a center of a substrate and a center of a depression in a chuck. The method includes measuring a gap between an edge of the substrate disposed inside the depression and an edge of the depression at a plurality of locations, determining a center of the substrate using the measurements of the gap, and determining a chuck centering offset of the substrate between the center of the depression and the measured center of the substrate at the chuck. The method further includes providing the substrate to a prealigner and determining a center of the substrate at the prealigner, determining a prealigner centering offset between a nominal center of the substrate and the measured center of the substrate at the prealigner, and combining the chuck centering offset and the prealigner centering offset to obtain a global centering offset.

The method may further include determining a position of the edge of the depression and calculating a center of the depression.

In an embodiment of the invention, determining the chuck centering offset includes determining the position of the center of the substrate relative to the position of the center of the depression.

In an embodiment of the invention, measuring the gap includes scanning the gap across an optical beam and measuring an intensity variation in a reflection of the optical beam.

In an embodiment of the invention, determining the center of the substrate using the measurements of the gap includes determining a position of the edge of the substrate and calculating the position of the center of the substrate from the position of the edge.

In an embodiment of the invention, the substrate can be disposed inside the depression and can be removed from the depression using a substrate handler.

The method may further include calibrating the substrate handler to take into account the global centering offset.

In an embodiment of the invention, calibrating the substrate handler includes shifting positioning of substrates by the substrate handler by an offset to correct for the global centering offset so that a subsequently positioned substrate is substantially centered inside the depression.

In an embodiment of the invention, calibrating the substrate handler includes correcting for substrate positioning so that the gap of a subsequently positioned substrate is equally wide inside the depression.

A further aspect of the present invention is to provide a method for determining an offset between a center of a substrate and a center of a depression in a chuck. The method includes loading the substrate on a pin of the chuck and moving the substrate by translating the pin in a first direction until the substrate reaches an opening of the depression in the chuck, determining to what extent the substrate should be translated in a plane substantially perpendicular to the first direction to allow the substrate to enter inside the depression without colliding with a surface of the chuck or an edge of the depression in the chuck, and determining the offset of the substrate relative to the depression from determination of the translation in the plane.

In an embodiment of the invention, determining to what extent the substrate should be translated includes translating the substrate, in the plane on the pin relative to the chuck, translating the chuck, in the plane, relative to the substrate or the pin, or both, until a footprint of the substrate would fit into the depression.

In an embodiment of the invention loading the substrate on a pin of the chuck is performed with a substrate handler.

The method may also include calibrating the substrate handler to take into account the offset.

In an embodiment of the invention, calibrating the substrate handler includes shifting positioning of substrates by of the substrate handler by an amount to correct for the offset so that a subsequently positioned substrate is substantially centered inside the depression.

In an embodiment of the invention, calibrating the substrate handler includes correcting for substrate positioning so that the gap of a subsequently positioned substrate is equally wide inside the depression.

Another aspect of the present invention is to provide a lithographic projection apparatus. The lithographic apparatus includes a support structure configured to hold a patterning device. The patterning device is configured to pattern a beam of radiation according to a desired pattern. The lithographic apparatus also includes a substrate table configured to hold a substrate. The substrate table has a depression for receiving the substrate. The lithographic apparatus has a projection system configured to project the patterned beam onto a target portion of the substrate. The lithographic apparatus also includes a liquid supply system configured to provide a liquid, through which the patterned beam is to be projected, in a space between the projection system and the substrate and a sensor configured to measure a position of the substrate, a sensor configured to measure a gap between an edge of the substrate disposed inside the depression and an edge of the depression, or a sensor configured to measure both the position and the gap. The lithographic apparatus further includes a substrate handling system in communication with the sensor configured to position the substrate inside the depression such that the gap between the edge of the substrate and the edge of the depression is substantially uniform inside the depression.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
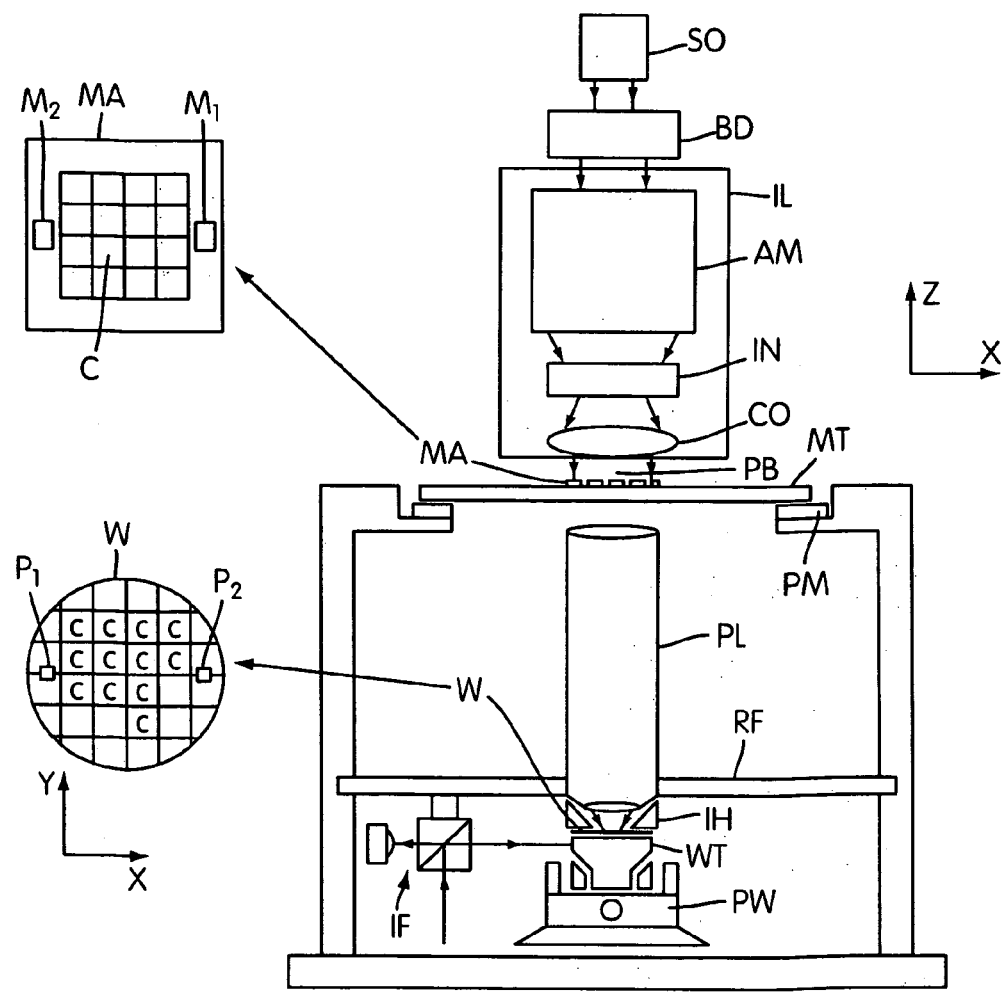
FIG. 1 depicts a lithographic apparatus according to an embodiment of the invention.
Figure 2:
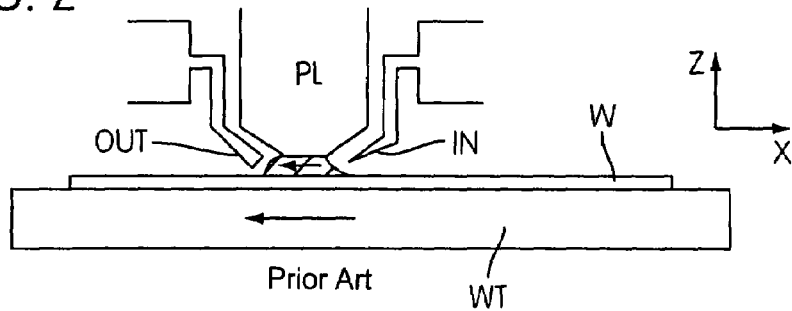
FIGS. 2 and 3 depict a liquid supply system for use in a lithographic projection apparatus.
Figure 3:
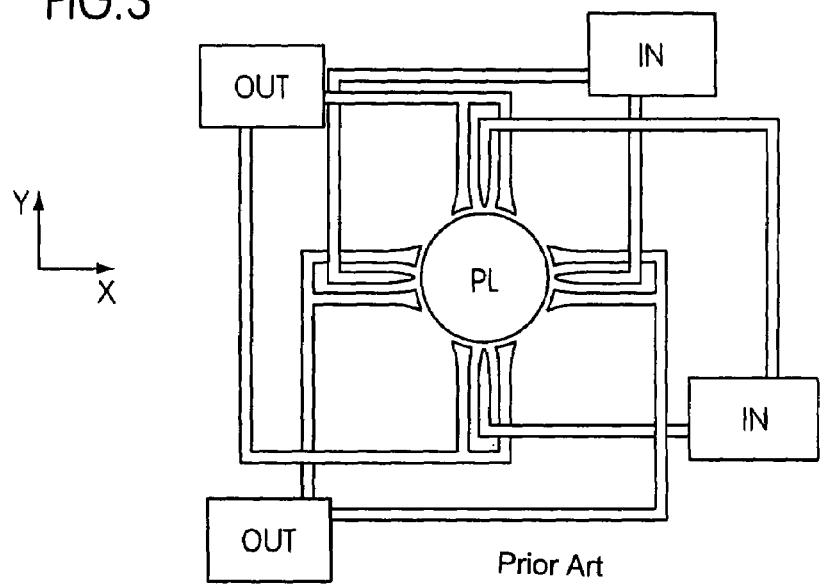

FIG. 1 schematically depicts a lithographic apparatus according to one embodiment of the invention. The apparatus comprises:

an illumination system (illuminator) IL configured to condition a radiation beam PB (e.g. UV radiation or DUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PL configured to project a pattern imparted to the radiation beam PB by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam PB is incident on the patterning device (e.g., mask MA), which is held on the support structure (e.g., mask table MT), and is patterned by the patterning device. Having traversed the mask MA, the radiation beam PB passes through the projection system PL, which focuses the beam onto a target portion C of the substrate W. An immersion hood IH, which is described further below, supplies immersion liquid to a space between the final element of the projection system PL and the substrate W.

With the aid of the second positioner PW and position sensor IF (e.g. an interferometric device, linear encoder or capacitive sensor), the substrate table WT can be moved accurately, e.g. so as to position different target portions C in the path of the radiation beam PB. Similarly, the first positioner PM and another position sensor (which is not explicitly depicted in FIG. 1) can be used to accurately position the mask MA with respect to the path of the radiation beam PB, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks).

Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 4:
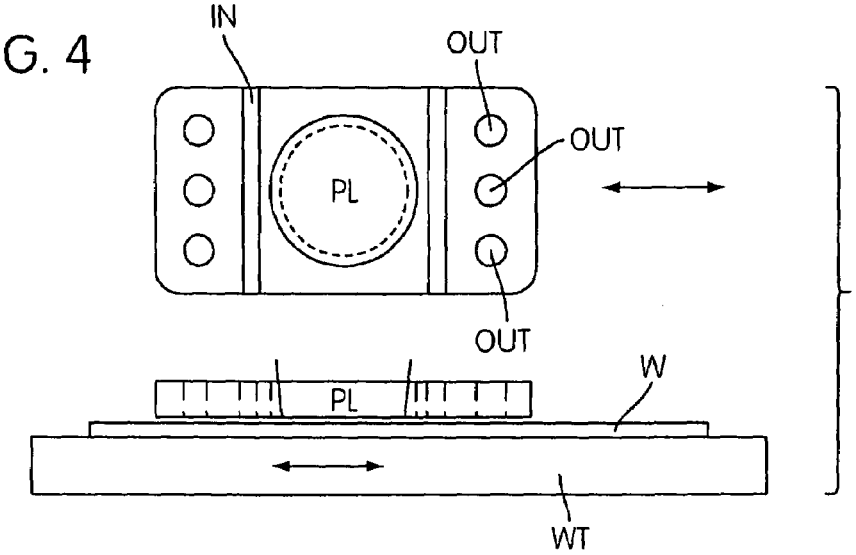
FIG. 4 depicts another liquid supply system for use in a lithographic projection apparatus.

A further immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

Figure 5:
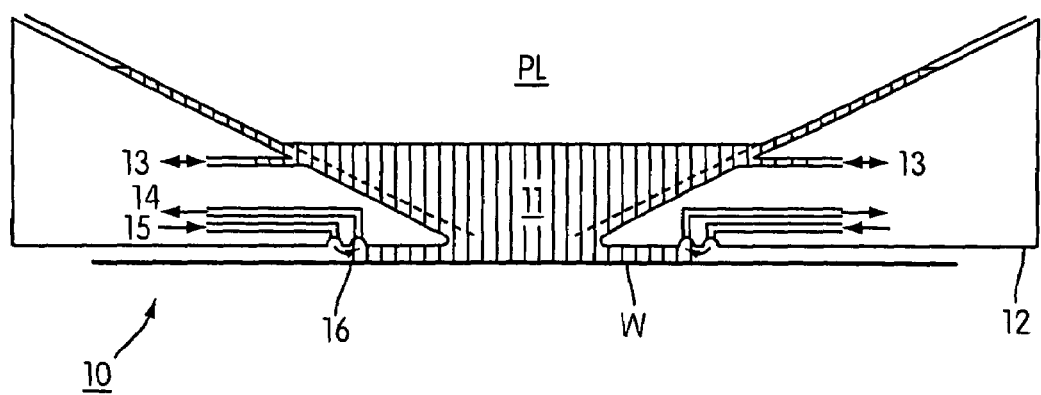
FIG. 5 depicts a further liquid supply system for use in a lithographic projection apparatus.

Another immersion lithography solution with a localized liquid supply system solution which has been proposed is to provide the liquid supply system with a seal member which extends along at least a part of a boundary of the space between the final element of the projection system and the substrate table. Such a solution is illustrated in FIG. 5. The seal member is substantially stationary relative to the projection system in the XY plane though there may be some relative movement in the Z direction (in the direction of the optical axis). A seal is formed between the seal member and the surface of the substrate.

Referring to FIG. 5, reservoir 10 forms a contactless seal to the substrate around the image field of the projection system so that liquid is confined to fill a space between the substrate surface and the final element of the projection system. The reservoir is formed by a seal member 12 positioned below and surrounding the final element of the projection system PL. Liquid is brought into the space below the projection system and within the seal member 12. The seal member 12 extends a little above the final element of the projection system and the liquid level rises above the final element so that a buffer of liquid is provided. The seal member 12 has an inner periphery that at the upper end, in an embodiment, closely conforms to the shape of the projection system or the final element thereof and may, e.g., be round. At the bottom, the inner periphery closely conforms to the shape of the image field, e.g., rectangular though this need not be the case.

The liquid is confined in the reservoir by a gas seal 16 between the bottom of the seal member 12 and the surface of the substrate W. The gas seal is formed by gas, e.g. air or synthetic air but, in an embodiment, $N_2$ or another inert gas, provided under pressure via inlet 15 to the gap between seal member 12 and substrate and extracted via first outlet 14. The overpressure on the gas inlet 15, vacuum level on the first outlet 14 and geometry of the gap are arranged so that there is a high-velocity gas flow inwards that confines the liquid. Such a system is disclosed in U.S. patent application Ser. No. 10/705,783, hereby incorporated in its entirety by reference.

Figure 6:
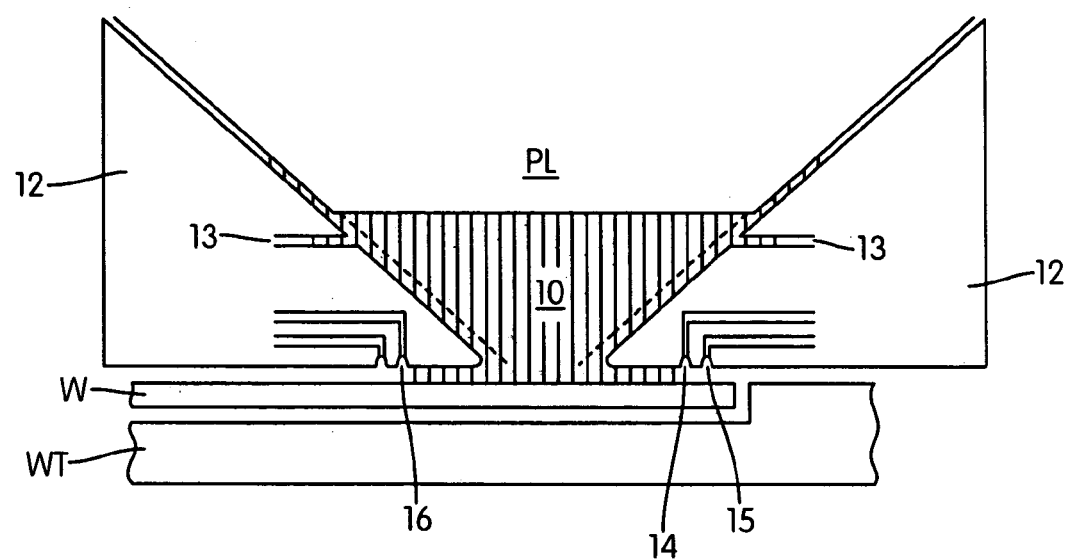
FIG. 6 depicts the liquid supply system of FIG. 5 in relation to with a substrate and substrate table according to an embodiment of the invention.

The reservoir 10 between the final element of the projection system and the substrate which is filled with liquid may come close to an edge of the substrate W during the scanning operation of the substrate. In order to limit or prevent liquid leakage when exposing an edge of the substrate, the substrate is arranged such that an upper surface of the substrate W is at substantially a same level as the substrate table (or chuck) WT, as illustrated in FIG. 6. For example, the substrate is disposed in a depression or a cavity DP in the chuck WT so that the upper surface of the substrate is at substantially a same level as the chuck. While the depression DP is shown as circular herein, the depression DP may be any other shape.

Figure 7:
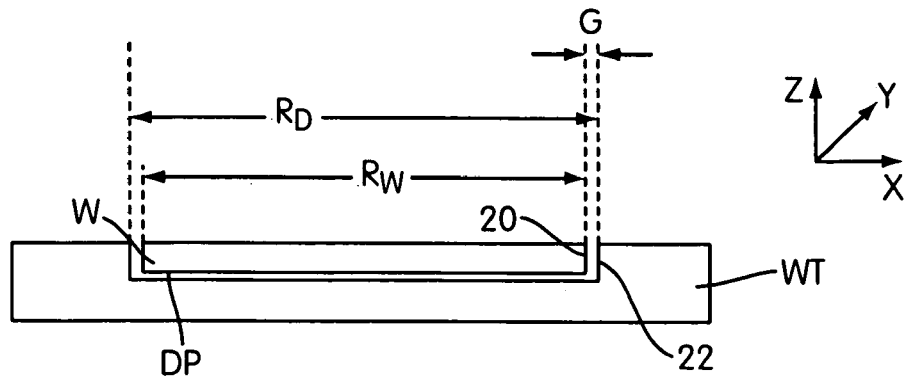
FIG. 7 shows a substrate table having a depression in which a substrate is disposed, according to an embodiment of the invention.

As shown in more detail in FIG. 7, because liquid may seep between an edge 20 of the substrate W and an edge 22 of the depression DP, the radial dimension $R_D$ of the depression DP in the chuck WT (in the plane XY) is selected to be as close as possible to the radial dimension $R_W$ of the substrate. Furthermore, because the gas seal 16 (shown in FIG. 6) between the bottom of the seal member 12 and the surface of the substrate W may hover between the edge 20 of the substrate W and the edge 22 of the depression DP, for example, when an edge of the substrate is exposed to radiation, the gas seal may become unstable. Therefore, for this additional reason, the radial dimension $R_D$ of the depression DP in the chuck WT (in the plane XY) is selected to be as close as possible to the radial dimension $R_W$ of the substrate. However, in practice the radial dimension $R_D$ of the depression DP is made to be slightly larger than the radial dimension $R_W$ of the substrate to allow the substrate to enter inside the depression and also to facilitate removal of the substrate. But, at the same time, the dimension of the depression is selected so as to limit or prevent seepage of liquid between an edge 20 of the substrate W and an edge 22 of the depression DP in the chuck WT.

Figure 8:
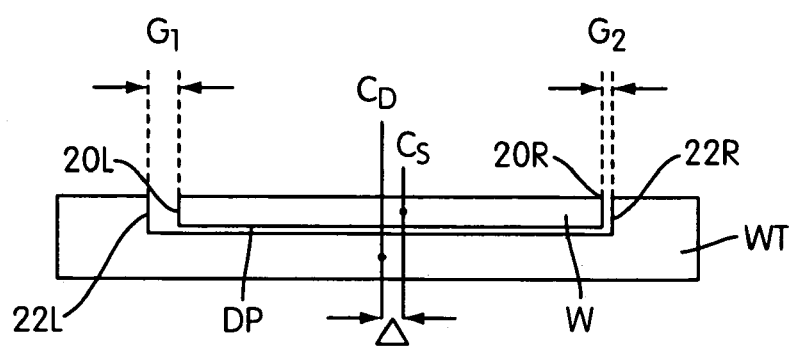
FIG. 8 shows a situation where a substrate is disposed inside a depression in a substrate table and the substrate is not centered relative to the depression according to an embodiment of the invention.

In an implementation, a gap G between the edge 20 of the substrate W and the edge 22 of the depression DP, of for example 0.5 mm, is made available to all sides of a well-centered substrate W. Due to, for example, inaccuracies of the substrate hander in handling and positioning the substrate inside the depression in the chuck, however, the substrate may not be perfectly centered, as illustrated in FIG. 8. For example, the edge 20R of the substrate W is closer to the edge 22R of the depression DP than the edge 20L of the substrate W is with respect to the edge 22L of the depression DP. In other words, the gap G1 between the edge 20L of the substrate and the edge 22L of depression is larger than the gap G2 between the edge 20R of the substrate and the edge 22R of the depression. In this case, an offset $\Delta$ of a center $C_S$ of the substrate W with respect to the center $C_D$ of the depression DP (or vice versa) is present. In an embodiment, the offset may be a vector and values for the offset referenced herein may be the length of the offset vector. In practice, an offset $\Delta$ of maximally 0.6 mm with a random variation of 0.1 mm may be present.

In conventional lithographic projection apparatus, i.e., non-immersion lithographic projection apparatus, it is not required to correct an offset between the substrate center and the chuck center during placement of the substrate on the chuck. The substrate W is loaded and positioned on the chuck and then the offset between centers (if not already partially corrected during placement of the substrate of the chuck) can be corrected to the expected position of the substrate itself.

In an immersion lithographic projection apparatus, however, the substrate W is disposed inside the depression DP in the chuck WT and the offset $\Delta$ as discussed above can be as much as 0.6 mm, for example. This may lead to the situation where one edge, for example edge 20L, of the substrate 20 is distant from an edge, for example edge 22L, of the depression DP by as much as 1.0 mm. This gap G1 on one side of 1.0 mm corresponds to the initial G gap on one side of 0.5 mm (if the substrate is well-centered inside the depression) compounded with an offset $\Delta$ of 0.5 mm. This gap G1 of 1.0 mm at one side of the substrate may be too large which may lead to seepage of liquid through this gap and/or may lead to instability of the gas seal hovering on top of the gap G1. This may be particularly undesirable in lithography because this may require removal of the substrate and cleaning of the substrate and substrate table which leads inevitably to slowing down of the production process or may lead to unstability of the gas seal which would also lead to problems in holding the liquid in place.

In addition, if, for example, the offset $\Delta$ is 0.6 mm, the substrate edge 20R can hit the edge 22R of the depression DP because the offset $\Delta$ of 0.6 mm is greater than the supposed available G gap of 0.5 mm if the substrate W was well-centered ($\Delta > G$). In this condition, the substrate W cannot be loaded inside the depression DP. This situation is also undesirable because any error in the placement of a substrate W during manufacturing may lead to a downtime of the machine resulting in loss of productivity.

Therefore, it is desired to determine the offset $\Delta$ of the substrate W inside the depression DP so that the substrate handling system can be calibrated to take into account the offset so that the above unwanted situation or situations may be prevented. If the offset of the substrate inside the depression is determined and the substrate handling system calibrated to take into account the offset, it may be possible the tailor the dimension(s) of the depression so that the substrate fits more precisely in the depression and as a result the gap can be further minimized.

In an embodiment, a method for determining the offset between the center of the substrate and the center of the depression is to use a slightly smaller test substrate W than the depression DP and then a normal production substrate to ensure that the test substrate W can be loaded by the substrate handler independent of the size of the offset. For example, the dimension of the test substrate W can be selected such that the gap G (for example 1.0 mm) is greater than a maximum offset $\Delta$ (for example 0.6 mm), i.e., $G > \Delta$ max. In this situation, even if the offset is maximum, e.g., equal to 0.6 mm, the test substrate W would still be able to be placed inside the depression DP because an offset of 0.6 mm is smaller than a gap G of 1.0 mm. The substrate handler loads the test substrate W with the intention that it is centered in the depression DP (even though there may in fact be an unknown offset). With the test substrate disposed inside the depression DP, the determination and calibration of the offset can be performed.

Figure 9:
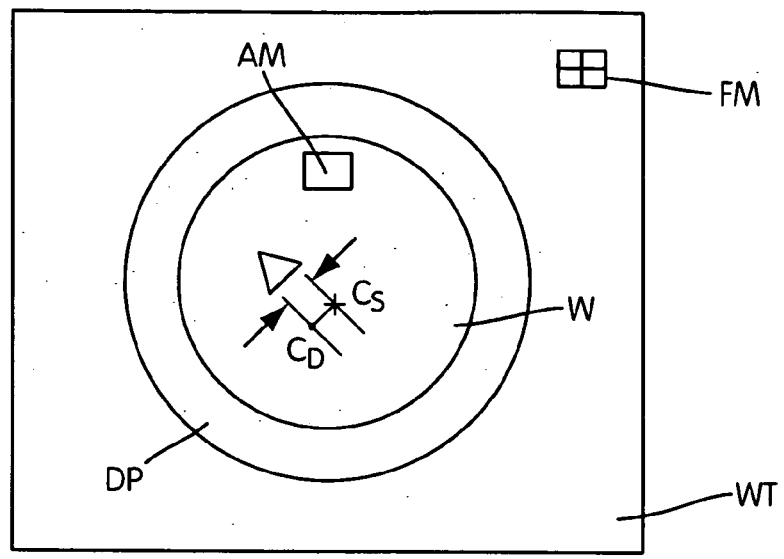
FIG. 9 shows a substrate with an alignment mark disposed inside a depression of substrate table, and the substrate table having a reference mark, according to an embodiment of the invention.

Referring to FIG. 9, an alignment mark AM is provided on the test substrate W and the position of the center of the substrate $C_S$ relative to the alignment mark AM on the test substrate W can be determined or is otherwise known. For example, the position of the center $C_S$ of the test substrate W relative to the position of the alignment mark AM of the test substrate W may be measured with a prealigner. A prealigner is an apparatus in the substrate handler which centers the substrate to a certain position in the coordinates of the substrate handler based on edge sensing information or optical detection of alignment marks on the substrate W. The chuck WT is also provided with a reference mark (i.e., a fiducial mark) FM and the position of the center $C_D$ of the depression DP relative the position of the fiducial mark FM can also be determined or is otherwise known. Then, for example, by measuring the position of the alignment mark AM of the test substrate W relative to the position of the reference mark FM (or vice versa), the offset $\Delta$ between the center $C_S$ of the test substrate W and the center $C_D$ of the depression DP can be determined. The position of the alignment mark AM and the reference mark FM may be measured for example with available optical systems such as an interferometer and an optical alignment system.

In addition, or alternatively, the lithographic apparatus may have nominal positions for where the alignment mark AM and the fiducial mark FM should be located for proper centering of the test substrate W. Once the test substrate W is disposed in the depression DP, the actual positions of the alignment mark AM and the fiducial mark FM can be determined and the offset $\Delta$ can be determined from the difference between the nominal and actual positions.

By knowing the offset $\Delta$ in the positioning of the test substrate W, the substrate handler can be calibrated to take into account the offset $\Delta$. In particular, the position of the mechanism of the substrate handler may be calibrated so that any position of a substrate by the substrate handler may correct for the offset. In this manner, subsequent loads of production substrates onto the substrate table will be properly centered in the depression DP.

In another embodiment, a method for determining the offset $\Delta$ between the center of the substrate and the center of the depression is, for example, to "manually" dispose a typical production substrate W in the depression DP to ensure that the substrate W is inside the depression DP. By "manually" disposing is meant that the substrate W is in the depression DP. This may be done, for example, by a technician putting the substrate W in the depression DP, by the normal operation of the substrate handler if the substrate W properly goes into the depression DP, by combination of normal operation of the substrate handler W and subsequent adjustments made to the position of the substrate W by, e.g., the substrate handler so that the substrate W is properly disposed in the depression DP or by any other means.

Figure 10:
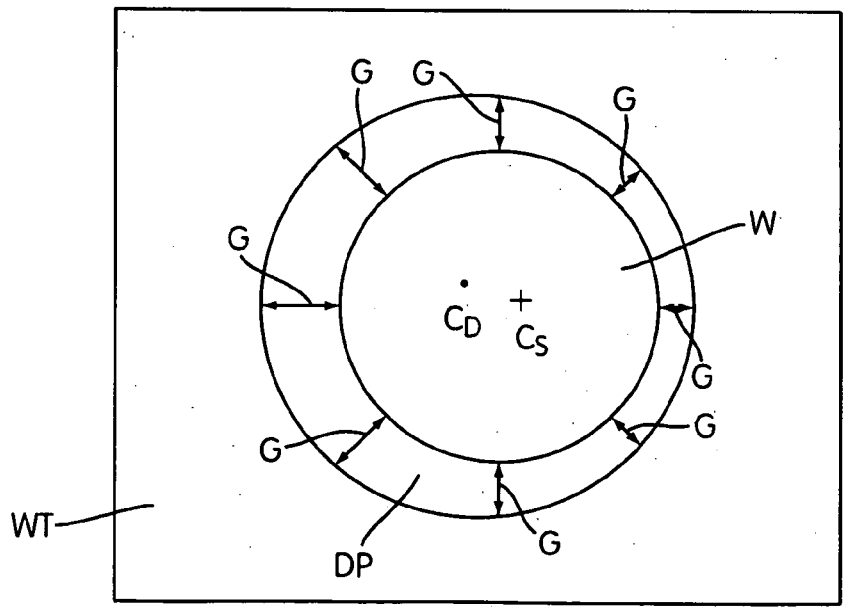
FIG. 10 shows a substrate disposed inside a depression and a gap between an edge of the substrate and an edge of the depression at various locations, according to an embodiment of the invention.

With the substrate disposed inside the depression DP, as shown in FIG. 10, the width of the gap G between an edge of the substrate and an edge of the depression DP is measured at a plurality of locations (at least 3) around the substrate W. This is performed by using, for example, an optical system such as a level sensor. For example, while the substrate W is disposed inside the depression DP, a radiation beam is scanned across the gap (for example, by displacing the substrate table WT while the beam is kept in position) and an intensity variation is measured in a reflection of the beam. By measuring the intensity of the radiation while the beam is moved across the gap, the width of the gap can be measured, for example, by a position/displacement measuring system (or the substrate table WT). Using the measurements of the gap at the plurality of locations, the center CS of the substrate W can be determined in the coordinate system of the chuck. For example, using the measurements of the gap width and the position on the edge of the depression DP of one and of the gap G, the position of the edge of the substrate can be determined and hence the position of the center of the substrate can be determined.

In an alternative or additional embodiment, the position of the edge of the substrate W at a plurality of locations can be measured directly using, for example, an intensity variation at a scanning radiation beam of a level sensor and the position of the impact of that beam on the substrate/substrate table determined from an interferometer measurement of the position of the substrate table.

The position of the center $C_D$ of the depression DP in the coordinate system of the chuck can either be known from other measurements or can be also determined by measurements of the edge of the depression DP. With the knowledge of the position of the center $C_S$ of the substrate and the position of the center $C_D$ of the depression, the chuck centering offset of the substrate W in the depression DP, i.e., in the chuck coordinate system, can be determined. The chuck centering offset $\Delta$ can, for example, be determined by calculating the position of the center $C_S$ of the substrate W relative to the position of the center $C_D$ of the depression DP.

Subsequently, the substrate W is provided, by using a substrate handler, to a prealigner and the position of the center $C_S$ of the substrate W is measured with the prealigner. The prealigner has a nominal center of the substrate W in the pre-aligner coordinate system. A pre-aligner centering offset can be determined between the normal and measured centers of the substrate W in the prealigner coordinate system. The chuck centering offset in the chuck coordinate system and the prealigner center of offset in the prealigner coordinate system are then combined and a global offset is calculated. The substrate handler is calibrated to take into account the global offset. In the calibration of the substrate handler, the positioning, i.e., coordinate system, of substrates by the substrate handler is corrected to take account of the global offset so that the gap of a substrate subsequently positioned in the depression is equally wide and thus the substrate is substantially centered inside the depression.

A chuck is typically provided with a substrate displacement mechanism that includes at least one pin. The mechanism is used to displace the substrate onto the chuck or to displace the substrate from the chuck. The substrate is positioned on and/or carried away from the substrate replacement mechanism, or the chuck itself, by a substrate handler. The substrate handler is typically a motor driven robot arm that has a fork for carrying the substrate. In the case of an immersion lithographic apparatus, the pin or pins are provided inside the depression in the chuck so that the substrate can be displaced into and out of the depression.

Figure 11:
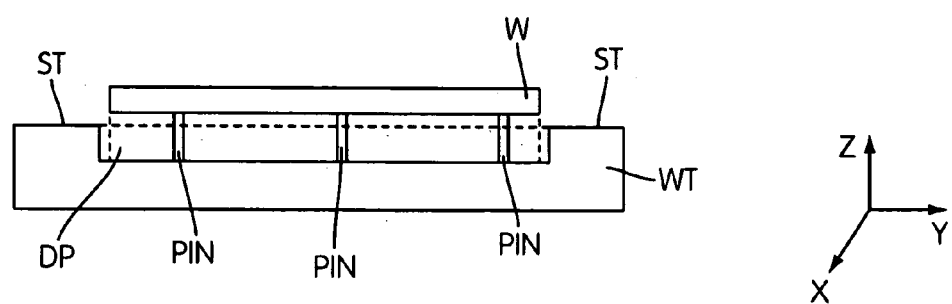
FIG. 11 shows a situation where a substrate is held by one or more pins above the opening of the depression in accordance with an embodiment of the present invention.

In an embodiment of the invention, a method for determining the offset between the center of the substrate W and the center of the depression DP is to load a substrate W on a pin or pins of the chuck WT, as shown in FIG. 11, by using the substrate handler and then displacing the substrate W by, e.g., lowering in the Z direction, the pin(s) until the substrate W reaches the opening of the depression DP in the chuck WT. The substrate is displaced until it reaches the limit of the opening of the depression DP in the chuck WT (as illustrated in FIG. 11) so as to ensure that the substrate does not collide with a surface ST of the chuck or an edge of the depression DP. Although three pins are shown in FIG. 11, one can appreciate that one or more pins may be used to hold the substrate. Once the substrate W reaches the limit of the opening, a determination is made as to what extent the substrate W should be translated in X and/or Y coordinates to allow the substrate W to enter inside the depression DP without colliding with a surface of the chuck WT or an edge of the depression DP. Such a determination may be made, e.g., by using an alignment system to measure a mark on the substrate and a mark on the chuck WT. If a translator is needed, the substrate W may be translated in the X and/or Y directions on the pin(s) relative to the chuck WT, the chuck weight may be translated in the X and/or Y directions relative to the pin(s) or the substrate, or a combination of both translations may be made until a footprint of the substrate W would fit into the depression DP. The translation in X and/or Y directions used to make the substrate W footprint fit into the depression DP is then the offset $\Delta$ of the center of the substrate W relative to the depression DP.

With the offset $\Delta$, the substrate handler can be calibrated to take into account the offset $\Delta$. In the calibration of the substrate handler, the positioning of a substrate W by the substrate handler is shifted by the offset $\Delta$ to correct for the offset $\Delta$ so that a subsequent substrate loaded by the substrate handler to the chuck WT is centered inside the depression DP. As a result, subsequent substrate loads are positioned correctly on the pin(s) for positioning substrates centrally inside the depression without likelihood of collision with a surface of the chuck.

In European Patent Application No. 03257072.3, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, where applicable, the invention may take the form of a computer program containing one or more sequences of machine-readable instructions describing a method as disclosed above, or a data storage medium (e.g. semiconductor memory, magnetic or optical disk) having such a computer program stored therein.

The present invention can be applied to any immersion lithography apparatus, in particular, but not exclusively, those types mentioned above. The immersion liquid used in the apparatus may have different compositions, according to the desired properties and the wavelength of exposure radiation used. For an exposure wavelength of 193 nm, ultra pure water or water-based compositions may be used and for this reason the immersion liquid is sometimes referred to as water and water-related terms such as hydrophilic, hydrophobic, humidity, etc. may be used.

The descriptions above are intended to be illustrative, not limiting. Thus, it will be apparent to one skilled in the art that modifications may be made to the invention as described without departing from the scope of the claims set out below.

We claim:

1. A method for determining an offset between a center of a substrate and a center of a depression in a chuck, comprising:
   measuring a gap between an edge of the substrate disposed inside the depression and an edge of the depression at a plurality of locations;
   determining a center of the substrate using the measurements of the gap;
   determining a chuck centering offset of the substrate between the center of the depression and the measured center of the substrate at the chuck;
   providing the substrate to a prealigner and determining a center of the substrate at the prealigner;
   determining a prealigner centering offset between a nominal center of the substrate and the measured center of the substrate at the prealigner; and
   combining the chuck centering offset and the prealigner centering offset to obtain a global centering offset.

2. The method according to claim 1, further comprising determining a position of the edge of the depression and calculating a center of the depression.

3. The method according to claim 1, wherein determining the chuck centering offset comprises determining the position of the center of the substrate relative to the position of the center of the depression.

4. The method according to claim 1, wherein measuring the gap comprises scanning the gap across an optical beam and measuring an intensity variation in a reflection of the optical beam.

5. The method according to claim 1, wherein determining the center of the substrate using the measurements of the gap comprises determining a position of the edge of the substrate and calculating the position of the center of the substrate from the position of the edge.

6. The method according to claim 1, wherein the substrate is disposed inside the depression and removed from the depression using a substrate handler.

7. The method according to claim 6, further comprising calibrating the substrate handler to take into account the global centering offset.

8. The method according to claim 7, wherein calibrating the substrate handler includes shifting positioning of substrates by the substrate handler by an offset to correct for the global centering offset so that a subsequently positioned substrate is substantially centered inside the depression.

9. The method according to claim 7, wherein calibrating the substrate handler includes correcting for substrate positioning so that the gap of a subsequently positioned substrate is equally wide inside the depression.

10. A lithographic projection apparatus comprising:
    a support structure configured to hold a patterning device, the patterning device configured to pattern a beam of radiation according to a desired pattern;
    a substrate table configured to hold a substrate, the substrate table having a depression configured to receive the substrate;
    a projection system configured to project the patterned beam onto a target portion of the substrate;
    a liquid supply system configured to provide a liquid, through which the patterned beam is to be projected, in a space between the projection system and the substrate;
    a sensor configured to measure a position of the substrate and to measure a gap between an edge of the substrate disposed inside the depression and an edge of the depression; and
    a substrate handling system in communication with the sensor configured to position the substrate inside the depression such that the gap between the edge of the substrate and the edge of the depression is substantially uniform inside the depression.

11. The apparatus according to claim 10, wherein the substrate handling system is configured to be calibrated to correct for an offset between the substrate and the depression.

12. The apparatus according to claim 10, wherein the substrate handling system is configured to determine an offset between a center of the substrate and a center of the depression.

13. The apparatus according to claim 10, wherein the sensor configured to measure the position of the substrate is configured to measure a position of an alignment mark of a test substrate disposed inside the depression, and wherein the substrate handling system is configured to determine an offset between a center of the test substrate and a center of the depression from the position of the alignment mark measured by the sensor.

14. The apparatus according to claim 10, wherein the substrate handling system is configured to determine to what extent the substrate should be translated in a plane substantially parallel to the substrate table to allow the substrate to enter inside the depression without colliding with a surface of the substrate table or an edge of the depression.

15. The apparatus according to claim 14, wherein the substrate handling system is configured to determine an offset between the substrate and the depression from determination of the translation in the plane.

16. The apparatus according to claim 10, wherein the substrate handling system is configured to determine a center of the substrate using measurements of the gap and to determine an offset of the substrate between a center of the depression and the measured center of the substrate.

17. The apparatus according to claim 16, further comprising a prealigner configured to measure a center of the substrate at the prealigner and wherein the substrate handling system is configured to determine a centering offset at the prealigner between a nominal center of the substrate and the measured center of the substrate at the prealigner.

18. The apparatus according to claim 17, wherein the substrate handling system is configured to combine the offset of the substrate and the centering offset to obtain a global centering offset.

* * * * *